United States Patent
Kang et al.

(10) Patent No.: US 10,014,043 B2
(45) Date of Patent: Jul. 3, 2018

(54) MEMORY DEVICE HAVING COMMAND WINDOW GENERATOR

(71) Applicant: SAMSUNG ELECTRONICS CO., LTD., Suwon-si, Gyeonggi-do (KR)

(72) Inventors: Sukyong Kang, Suwon-si (KR); Hun-Dae Choi, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/606,963

(22) Filed: May 26, 2017

(65) Prior Publication Data

US 2018/0012638 A1    Jan. 11, 2018

(30) Foreign Application Priority Data

Jul. 5, 2016    (KR) .................. 10-2016-0085067

(51) Int. Cl.
| | | |
|---|---|---|
| *G11C 7/10* | (2006.01) | |
| *G11C 7/22* | (2006.01) | |
| *G11C 11/4076* | (2006.01) | |
| *G11C 11/4096* | (2006.01) | |

(52) U.S. Cl.
CPC .............. *G11C 7/222* (2013.01); *G11C 7/225* (2013.01); *G11C 7/227* (2013.01); *G11C 11/4076* (2013.01); *G11C 11/4096* (2013.01); *G11C 2207/2272* (2013.01)

(58) Field of Classification Search
CPC ......... G11C 7/222; G11C 7/225; G11C 7/227; G11C 11/4076; G11C 11/4096; G11C 2207/2272

USPC .................................................... 365/233.18
See application file for complete search history.

(56) References Cited

U.S. PATENT DOCUMENTS

| | | | |
|---|---|---|---|
| 5,448,699 A | 9/1995 | Goss et al. | |
| 7,751,261 B2 * | 7/2010 | Cho .................. | G11C 7/22 365/194 |
| 8,139,423 B2 | 3/2012 | Kang | |
| 8,144,531 B2 | 3/2012 | Choi et al. | |
| 8,531,897 B2 | 9/2013 | Kim | |
| 8,837,239 B2 | 9/2014 | Jung et al. | |
| 9,218,575 B2 | 12/2015 | Mozak et al. | |
| 2008/0192563 A1 * | 8/2008 | Cho .................. | G11C 7/22 365/233.17 |
| 2011/0058445 A1 * | 3/2011 | Fujisawa ............ | G11C 7/02 365/233.1 |

(Continued)

FOREIGN PATENT DOCUMENTS

| | | |
|---|---|---|
| KR | 1020120067696 | 6/2012 |
| KR | 1020140002913 | 1/2014 |

*Primary Examiner* — Pho M Luu
*Assistant Examiner* — Xiaochun L Chen
(74) *Attorney, Agent, or Firm* — F. Chau & Associates, LLC

(57) ABSTRACT

A memory device including a command window generator is provided. The command window generator is configured to generate a delay signal by converting a delay time between a clock signal input to a write path circuit and a clock signal output to a write path replica circuit into a number of cycles of an internal clock signal, by using the write path circuit and the write path replica circuit, and generate a command window to correspond to a data window using the delay signal. The delay window may correspond to a burst length of write data.

20 Claims, 15 Drawing Sheets

(56) References Cited

U.S. PATENT DOCUMENTS

2011/0128794 A1\* 6/2011 Yoon ................... G11C 7/1051
365/189.05
2015/0221354 A1   8/2015 Palmer et al.

\* cited by examiner

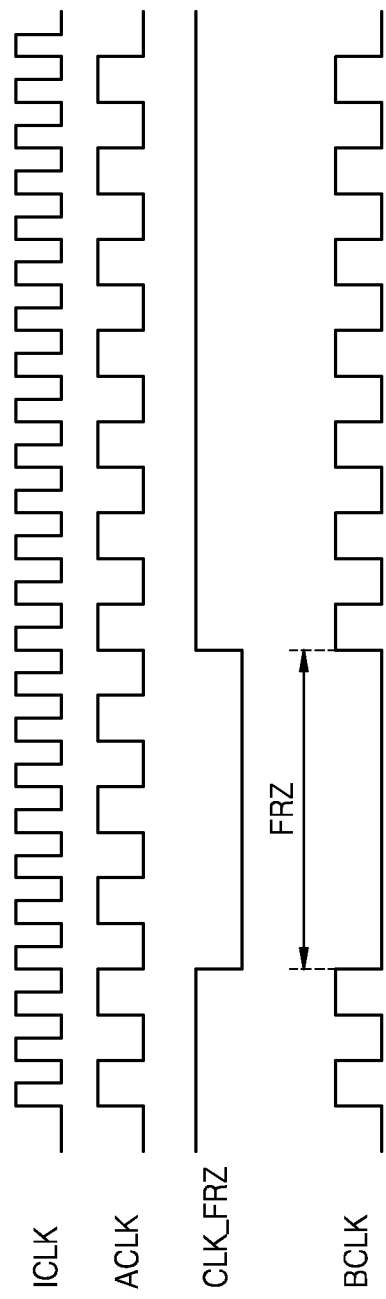

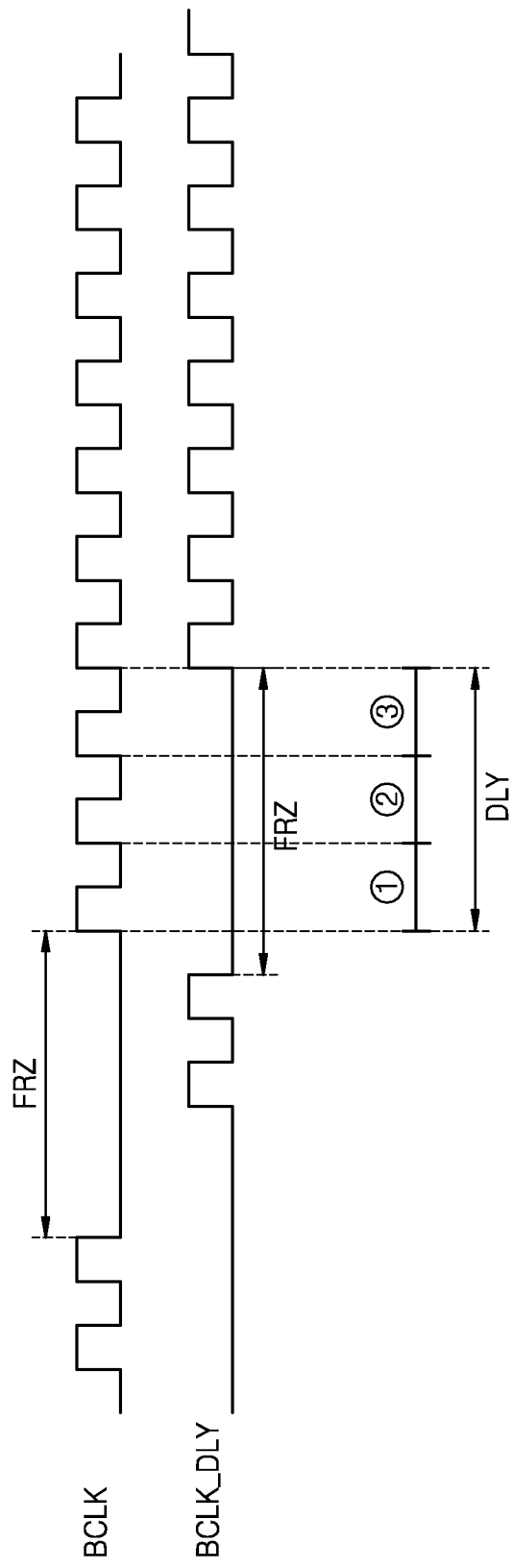

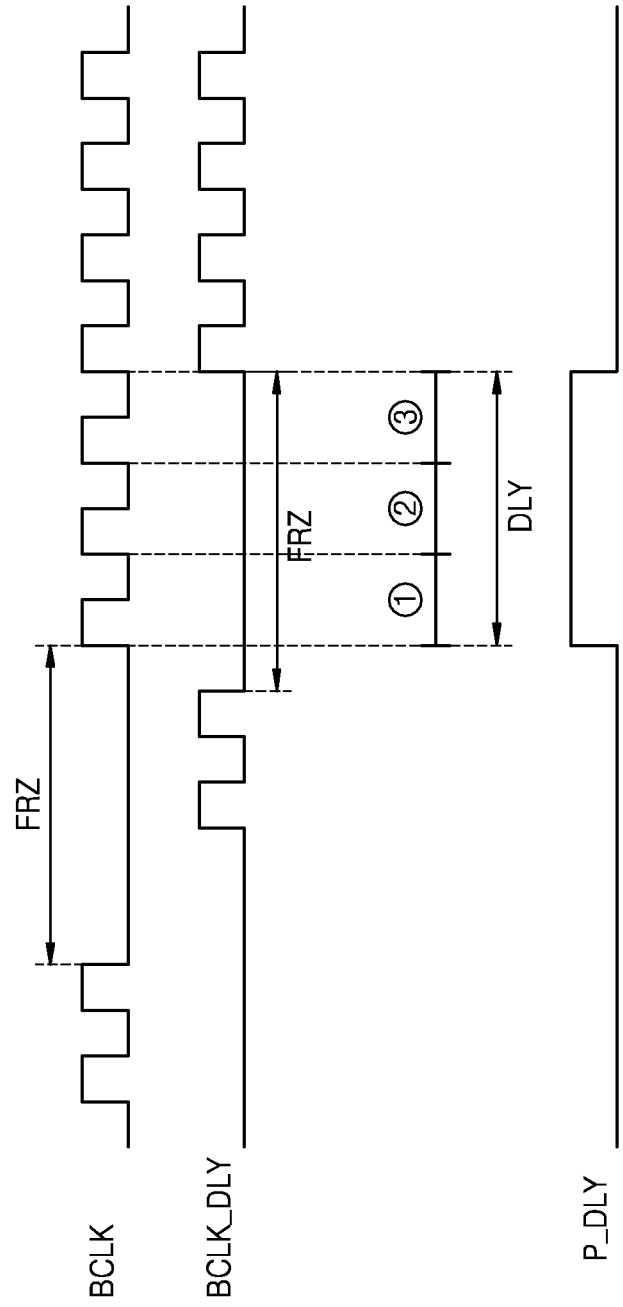

MEMORY DEVICE HAVING COMMAND WINDOW GENERATOR

CROSS-REFERENCE TO RELATED APPLICATION

This application claims priority to Korean Patent Application No. 10-2016-0085067, filed on Jul. 5, 2016, in the Korean Intellectual Property Office, the disclosure of which is incorporated by reference in its entirety herein.

BACKGROUND

1. Technical Field

The inventive concept relates to a semiconductor device, and more particularly, to a command window generator and a memory device including the same.

2. Discussion of Related Art

In dynamic random access memory (DRAM), latency is defined as a waiting time between applying a command and executing an operation corresponding to the command. When a write command is input to the DRAM, the DRAM latches write data, which is input to a data input circuit after a write latency (WL) from the write command. To latch the write data without data missing, a write command window for latching the write data is wider than a write data window during which data is available to be latched. When the write latency has a large value, the data input circuit may be driven unnecessarily, due to the wide write command window, thereby causing an increase in current consumption.

SUMMARY

At least one embodiment of the inventive concept provides a command window generator generating a command window set on a data window.

At least one embodiment of the inventive concept provides a memory device including the command window generator.

According to an exemplary of the inventive concept, there is provided a command window generator configured to generate a command window for processing data associated with a after a certain latency from receipt of the command. The command window generator includes a clock freezer circuit, a first circuit, a second circuit, and a delay measure circuit. The freezing circuit is configured to receive a first clock signal divided from an input clock signal and generate a second clock signal from the first clock signal. The second clock signal has a freezing section corresponding to a logic low section of a clock freezing signal. The first circuit is configured to receive the second clock signal as an input, and output the second clock signal after a first delay time. The second circuit has the same structure as the first circuit and is configured to receive an output of the first circuit as an input, and output a third clock signal after the first delay time. The delay measure circuit is configured to receive the second clock signal and the third clock signal as inputs, generate a delay signal by converting a delay time between the second clock signal and the third clock signal into a number of cycles of the input clock signal, and generate the command window to correspond to a data window of the data using the delay signal.

According to an exemplary embodiment of the inventive concept, there is provided a memory device including a memory cell array including a plurality of memory cells, a clock buffer configured to generate an internal clock signal in response to a clock signal CLK input thereto, a command decoder configured to generate a command signal by decoding a command which is received in synchronization with the internal clock signal, a command window generator configured to generate a command window for processing data associated with a command after certain latency from receipt of the command, and an input and output buffer configured to write data and provide the write data to the memory cell array, and provide read data read from memory cell array to a data bus, in response to the command window, wherein the command window generator is configured to generate a delay signal by converting a delay time between a second clock signal input to a first circuit and a third clock signal output to a second circuit into a number of cycles of the internal clock signal, by using the first circuit and the second circuit the same structure as the first circuit and connected in series with the first circuit, and adjust the command window to correspond to a data window of the data using the delay signal.

According to an exemplary embodiment of the inventive concept, there is provided a memory device including a memory cell array including a plurality of memory cells, a data latch that latches data that is to be written to the memory cell array or latches data that is read from the memory cell, according to a timing control signal, a clock dividing circuit configured to perform a dividing operation on an input clock signal to generate a first clock signal, a shortstop circuit configured to set to a section of a first clock signal to a constant level to generate a second clock signal, a first circuit configured to receive the second clock signal as an input, and output the second clock signal after a first delay time, a second circuit configured to receive an output of the first circuit as an input, and output a third clock signal after the first delay time, and a third circuit configured to generate the timing control signal by converting a delay time between the second clock signal and the third clock signal into a number of cycles of the input clock signal.

BRIEF DESCRIPTION OF THE DRAWINGS

Embodiments of the inventive concept will be more clearly understood from the following detailed description when taken in conjunction with the accompanying drawings in which:

FIGS. 3A and 3B are diagrams of a clock freezer of FIG. 2 according to an exemplary embodiment of the inventive concept;

FIG. 4 is a diagram for describing an operation of a delay measure circuit of FIG. 2;

FIGS. 8A and 8B are diagrams of the command window generator of FIG. 1 according to an exemplary embodiment of the inventive concept;

DETAILED DESCRIPTION OF THE EMBODIMENTS

The inventive concept now will be described more fully hereinafter with reference to the accompanying drawings, in which elements of the invention are shown. The inventive concept may, however, be embodied in many different forms and should not be construed as limited to the exemplary embodiments set forth herein.

Figure 1:
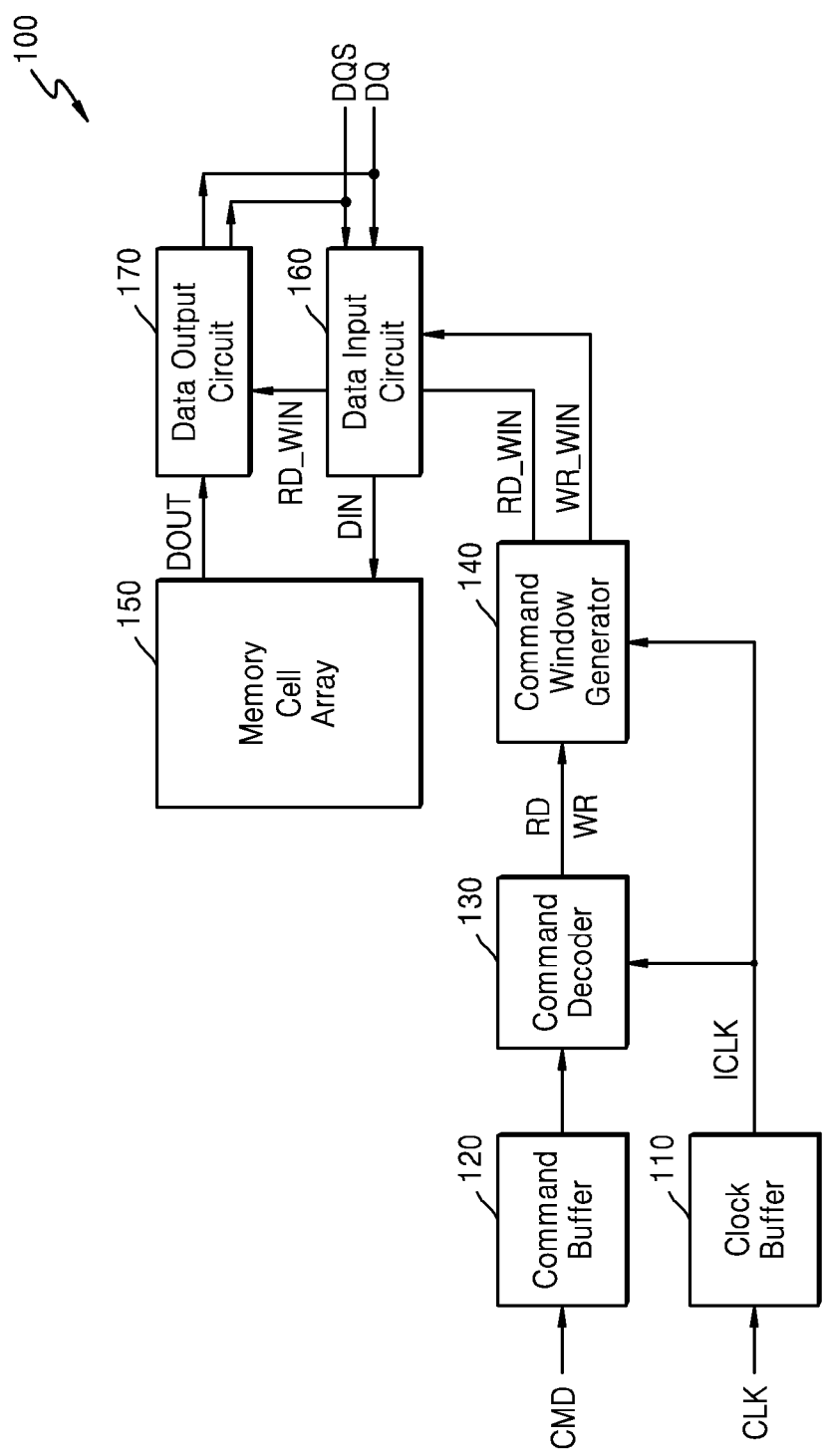
FIG. 1 is a diagram of a memory device including a command window generator, according to an exemplary embodiment of the inventive concept.

FIG. 1 is a diagram of a memory device 100 including a command window generator 140, according to an exemplary embodiment of the inventive concept.

Referring to FIG. 1, the memory device 100 includes a clock buffer 110, a command buffer 120, a command decoder 130, the command window generator 140, a memory cell array 150, a data input circuit 160, and a data output circuit 170. In an embodiment, the memory device 100 operates as a synchronous dynamic random access memory (SDRAM).

The clock buffer 110 generates an internal clock signal ICLK based on an input clock signal CLK. The internal clock signal ICLK may be provided to various circuit blocks in the memory device 100.

A command signal CMD, such as a clock enable signal CKE, a chip selection signal/CS, a row address strobe signal/RAS, a column address strobe signal/CAS, a write enable signal/WE, etc., is input to the command buffer 120, and the command buffer 120 provides the command signal CMD to the command decoder 130.

The command decoder 130 decodes the command signal CMD and generates control signals according to the decoded command signal CMD. The command decoder 130 may generate a read signal RD according to a read command signal CMD and generate a write signal WR according to a write command signal CMD. The read signal RD is a signal for controlling a read operation of the memory device 100 and may be provided to various circuit blocks in the memory device 100. The write signal WR is a signal for controlling a write operation of the memory device 100 and may be provided to various circuit blocks in the memory device 100.

The write signal WR generated by the command decoder 130 may be provided to the command window generator 140 and may operate as a flag signal for generating a write command window WR_WIN set on a write data window corresponding to a burst length BL after a write latency WL defined by the standards of the memory device 100. For example, the write command window WR_WIN is a signal that indicates when write data corresponding to the write signal WR is available on a data bus DQ. In an embodiment, the signal transitioning from a first logic level to a second logic level indicates the beginning time at which the write data of the burst length is available. The data is available while the signal maintains the second logic level. The data is no longer available once the signal transitions from the second logic level back to the first logic level.

The read signal RD generated by the command decoder 130 may be provided to the command window generator 140 and may operate as a flag signal for generating a read command window RD_WIN set on a read data window corresponding to a burst length BL after a read latency RL defined by the standards of the memory device 100. For example, the read command window RD_WIN is a signal that may indicate when data read from the memory cell array 150 corresponding to the read signal RD is available on the data bus DQ.

The command window generator 140 may generate the write command window WR_WIN set on the write data window by compensating in advance for a delay time on a data write path based on the write signal WR and the internal clock signal ICLK. Also, the command window generator 140 may generate the write command window WR_WIN set on the write data window by compensating in advance for a delay time on a write command path based on the write signal WR and the internal clock signal ICLK.

In an embodiment, the command window generator 140 outputs a delay signal by measuring a delay time between a clock signal input to a write path circuit and a clock signal output to a write path replica circuit, by using the write path circuit and the write path replica circuit connected in series with the write path circuit. In an embodiment, the command window generator 140 generates the write command window WR_WIN set on the write data window, in response to the delay signal. For example, the delay signal may be used to adjust the write command window WR_WIN so that its activated portion starts when the data is available.

The command window generator 140 may generate the read command window RD_WIN set on the read data window by compensating in advance for delay times on a data read path and/or a read command path based on the read signal RD and the internal clock signal ICLK.

The command window generator 140 may output a delay signal by measuring a delay time between a clock signal input to a read path circuit and a clock signal output to a read path replica circuit, by using the read path circuit and the read path replica circuit connected in series with the read path circuit. The command window generator 140 may generate the read command window RD_WIN set on the read data window, in response to the delay signal. For example, the delay signal may be used to adjust the read command window RD_WIN so that its activated portion starts when the data is available on the data bus DQ.

The memory cell array 150 may include a plurality of memory cells arranged in rows and columns. A memory cell may include one access transistor and one storage capacitor. In an embodiment, the memory cells are arranged such that the memory cells respectively intersect with cross points of a matrix including word lines and bit lines.

The memory cells of the memory cell array 150 may store write data provided from a memory controller located outside the memory device 100 as internal write data DIN. Also, the data stored in the memory cells of the memory cell array 150 may be output as read data DOUT.

The data input circuit 160 latches the write data input in synchronization with a data strobe signal DQS via a data bus DQ in response to the write command window WR_WIN. The data input circuit 160 may provide the latched write data to the memory cell array 150 as the internal write data DIN. In an embodiment, the data input circuit 160 includes a data input buffer and a data strobe buffer.

The data input circuit 160 provides the internal write data DIN in response to the write command window WR_WIN set on the write data window corresponding to the write data.

The write command window WR_WIN may be applied to the data input circuit 160 by being set on the write data window input to the data bus DQ by compensating in advance for delay times on the data write path and/or the write command path. Accordingly, the write data input to the data bus DQ may be directly latched by the data input circuit 160 and provided to the memory cell array 150 as the internal write data DIN.

That the write data input to the data bus DQ is directly latched via the write command window WR_WIN set on the write data window denotes that there is no need for the data input circuit 160 to be pre-driven and stand by in order to latch the write data input to the data bus DQ. In an exemplary embodiment, a power supply voltage is not provided to the data input circuit 160 until the write command window WR_WIN transitions from a first logic level to a second logic level. Thus, current consumption by the data input circuit 160 of the memory device 100 may be reduced, and accordingly, power consumption of the memory device 100 may be reduced.

The data output circuit 170 outputs the read data DOUT synchronized with the data strobe signal DQS to the data bus DQ, in response to the read command window RD_WIN set on the read data window corresponding to the read data DOUT of the memory cell array 150. In an embodiment, the data output circuit 170 includes a data output buffer and a data strobe buffer.

The data output circuit 170 outputs the read data DOUT to the data bus DQ in response to the read command window RD_WIN set on the read data window. The read command window RD_WIN is applied to the data output circuit 170 by being set on the read data window by compensating in advance for delay times on the data read path and/or the read command path.

The data output circuit 170 is driven during a section corresponding to the read command window RD_WIN and outputs the read data DOUT to the data bus DQ. The data output circuit 170 does not need to be driven in advance and stand by during a section wider than the read command window RD_WIN, in order to output the read data DOUT to the data bus DQ. In an exemplary embodiment, a power supply voltage is not provided to the data output circuit 170 until the read command window RD_WIN transitions from a first logic level to a second logic level. Thus, current consumption by the data output circuit 170 of the memory device 100 may be reduced, and accordingly, power consumption of the memory device 100 may be reduced.

Figure 2:
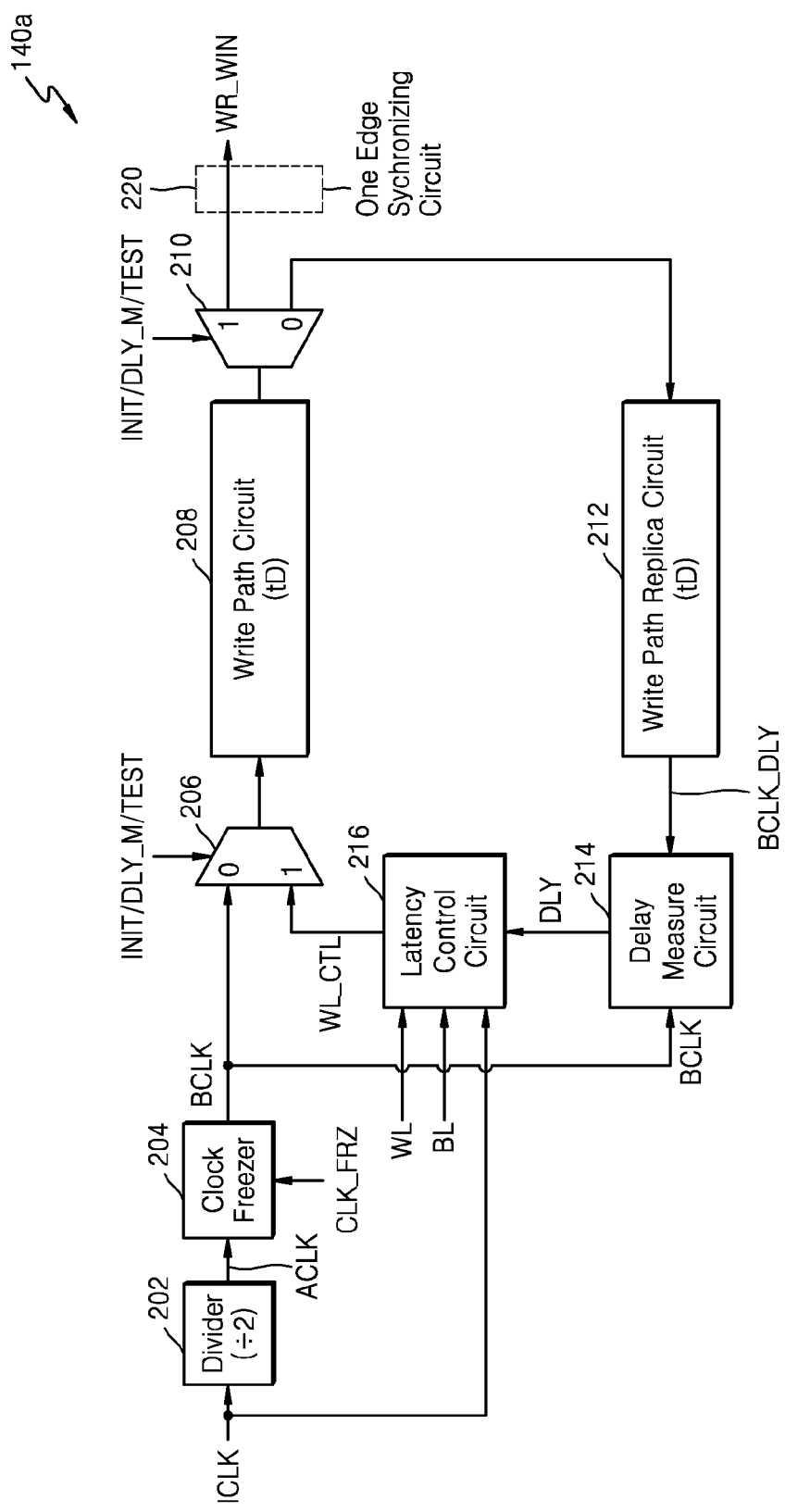
FIG. 2 is a diagram of the command window generator of FIG. 1 according to an exemplary embodiment of the inventive concept.

FIG. 2 is a diagram of the command window generator 140 of FIG. 1, according to an exemplary embodiment of the inventive concept.

Referring to FIG. 2, a command window generator 140a generates the write command window WR_WIN based on an internal clock signal ICLK, a clock freezing signal CLK_FRZ, a write latency WL, and a burst length BL. The write latency WL may be defined as a sum (AL+CWL) of an additive latency AL and a column address strobe CAS write latency CWL defined as a clock cycle delay period between an internal write command and a first bit of available input data. In an embodiment, the write latency WL is a certain number of clock cycles and the burst length BL indicates a number of bytes or words.

The command window generator 140a may generate the write command window WR_WIN by compensating in advance for delay times on a data write path and/or a write command path, for example, in response to an initialization signal INIT indicating an initialization operation of the memory device 100 (FIG. 1), in an initialization operation of the memory device 100 after power-up.

For example, the command window generator 140a may generate the write command window WR_WIN by compensating in advance for the delay times on the data write path and/or the write command path in response to a delay measurement signal DLY_M stored in a mode register of the memory device 100. Alternatively, the command window generator 140a may generate the write command window WR_WIN by compensating in advance for the delay times on the data write path and/or the write command path in response to a test signal TEST of the memory device 100.

The command window generator 140a includes a divider 202 (e.g., a dividing circuit), a clock freezer 204, first and second multiplexers 206 and 210, a write path circuit 208, a write path replica circuit 212, a delay measure circuit 214, and a latency control circuit 216.

The divider 202 receives the internal clock signal ICLK provided from the clock buffer 110 (FIG. 1) and divides the internal clock signal ICLK by two to generate a first clock signal ACLK. The first clock signal ACLK is provided to the clock freezer 204.

Figure 3A:
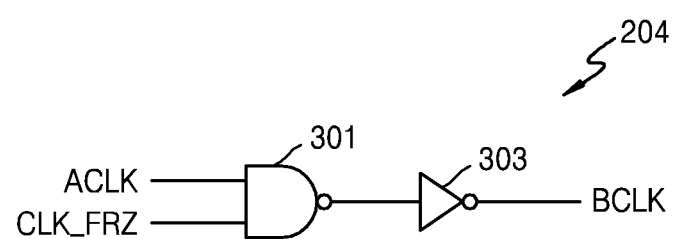

The clock freezer 204 receives the first clock signal ACLK, and deactivates the first clock signal ACLK during a certain section in response to a clock freezing signal CK_FRZ to output a second clock signal BCLK. In an embodiment, the clock freezer 204 is implemented by a shortstop circuit. In the embodiment shown in FIG. 3A, the clock freezer 204 includes a NAND gate 301 to which the first clock signal ACLK and the clock freezing signal CLK_FRZ are input, and an inverter 303 to which the output of the NAND gate 301 is input and outputting the second clock signal BCLK.

Operations of the divider 202 and the clock freezer 204 are illustrated in FIG. 3B. In FIG. 3B, the internal clock signal ICLK is divided by two to generate the first clock signal ACLK, and a section of the first clock signal ACLK, which corresponds to logic low of the clock freezing signal CLK_FRZ, is deactivated to generate the second clock signal BCLK. The second clock signal BCLK has a freezing section FRZ corresponding to the logic low section of the clock freezing signal CLK_FRZ. The freezing section FRZ of the second clock signal BCLK is used to convert a delay signal DLY measured by the delay measure circuit 214 into the number of cycles of the internal clock signal ICLK, which will be described in more detail below.

Referring back to FIG. 2, the second clock signal BCLK output by the clock freezer 204 is provided to the first multiplexer 206 and the delay measure circuit 214. The first multiplexer 206 receives the second clock signal BCLK via a first input terminal, receives a write latency control signal WL_CTL via a second input terminal, and in response to the initialization signal INIT, selects one of the second clock signal BCLK and the write latency control signal WL_CTL and outputs the selected one via an output terminal. For example, the first multiplexer 206 may output the second clock signal BCLK in response to logic low of the initialization signal INIT and output the write latency control signal WL_CTL in response to logic high of the initialization signal INIT. The write latency control signal WL_CTL is provided from the latency control circuit 216.

For example, the first multiplexer 206 may select one of the second clock signal BCLK and the write latency control signal WL_CTL and output the selected one in response to a delay measurement signal DLY_M stored in the mode register. Alternatively, the first multiplexer 206 may select one of the second clock signal BCLK and the write latency control signal WL_CTL and output the selected one in response to the test signal TEST of the memory device 100.

The first multiplexer 206 may select the second clock signal BCLK in response to a logic low of the initialization signal INIT and provide the selected second clock signal BCLK to the write path circuit 208. The write path circuit 208 may include circuit portions that are part of the data write path and circuit portions that are part of the write command path. The data write path may include a data input buffer and a data strobe buffer included in the data input circuit 160. In an embodiment, the write command path includes the command buffer 120 (FIG. 1) and the command decoder 130 (FIG. 1).

The write path circuit 208 may receive the second clock signal BCLK and output the second clock signal BCLK after a first delay time tD which is the sum of the delay times on the data write path and/or the write command path. The output of the write path circuit 208 is provided to the second multiplexer 210.

The second multiplexer 210 outputs the output of the write path circuit 208 to a first output terminal or a second output terminal in response to the initialization signal INIT. The second multiplexer 210 may output the output of the write path circuit 208 to the first output terminal in response to logic high of the initialization signal INIT and output the output of the write path circuit 208 to the second output terminal in response to logic low of the initialization signal INIT. The output of the first output terminal of the second multiplexer 210 is provided as the write command window WR_WIN and the output of the second output terminal is provided to the write path replica circuit 212.

For example, the second multiplexer 210 may output the output of the write path circuit 208 to the first output terminal or the second output terminal in response to the delay measurement signal DLY_M stored in the mode register. Alternatively, the second multiplexer 210 may output the output of the write path circuit 208 to the first output terminal or the second output terminal in response to the test signal TEST of the memory device 100.

The write path replica circuit 212 may have the same structure as the write path circuit 208. The write path replica circuit 212 inputs to the delay measure circuit 214 the output of the write path circuit 208, which is output by the second output terminal of the second multiplexer 210. The write path replica circuit 212 may output the output of the write path circuit 208 after a first delay time tD which is the same as the first delay time tD of the write path circuit 208.

The input to the write path replica circuit 212 is the second clock signal BCLK of the clock freezer 204, which is provided via the first multiplexer 206, the write path circuit 208, and the second multiplexer 210 when the initialization signal INIT is at a logic low. Since a selection operation performed by the first and second multiplexers 206 and 210 are relatively simple, delay times of the first and second multiplexers 206 and 210 may be ignored. Accordingly, the second clock signal BCLK input to the write path replica circuit 212 may be output as a third clock signal BCLK_DLY by being delayed by a delay time 2*tD, which is twice the sum of the first delay time tD of the write path circuit 208 and the first delay time tD of the write path replica circuit 212. The third clock signal BCLK_DLY is provided by the write path replica circuit (tD) 212 to the delay measure circuit 214.

The delay measure circuit 214 is input the second clock signal BCLK and the third clock signal BCLK_DLY, and outputs the delay signal DLY by measuring a delay time between the second clock signal BCLK and the third clock signal BCLK_DLY. The delay signal DLY denotes the sum 2*tD of the delay times of the write path circuit 208 and the write path replica circuit 212.

The delay time DLY output by the delay measure circuit 214 may be defined as the number of cycles of the second clock signal BCLK, counted in the freezing section FRZ of the third clock signal BCLK_DLY, as illustrated in FIG. 4. In FIG. 4, for example, 3 cycles of the second clock signal BCLK are counted in the freezing section FRZ of the third clock signal BCLK_DLY. Accordingly, the delay signal DLY is provided to the latency control circuit 216 as '3,' the counted number of cycles.

The reason why the delay signal DLY of the delay measure circuit 214 is defined as the number of cycles of the second clock signal BCLK, counted in the freezing section FRZ of the third clock signal BCLK_DLY, is because the counted number of cycles may be applied to the internal clock signal ICLK and a delay time of the internal clock signal ICLK corresponding to the corresponding counted number of cycles may be used as the delay signal DLY.

The third clock signal BCLK_DLY is generated through the write path circuit 208 and the write path replica circuit 212 in which the second clock signal BCLK has the same two first delay times tD, and the second clock signal BCLK is divided by two based on the internal clock signal ICLK. Thus, the delay signal DLY may be obtained by converting the number of cycles of the second clock signal BLK counted in the freezing section FRZ of the third clock signal BCLK_DLY into the number of cycles of the internal clock signal ICLK.

Via the delay signal DLY converted into the number of cycles of the internal clock signal ICLK, the first delay time tD of the write path circuit 208, which corresponds to a half of the delay time 2*tD that is twice as large as the sum of the first delay time tD of the write path circuit 208 and the first delay time tD of the write path replica circuit 212, may be estimated. Accordingly, the first delay time tD of the write path circuit 208 may be understood to be a delay time corresponding to the converted number of cycles of the internal clock signal ICLK.

The latency control circuit 216 generates the write latency control signal WL_CTL according to the internal clock signal ICLK and the delay signal DLY based on the write latency WL and the burst length BL. The latency control circuit 216 may generate the write latency control signal WL_CTL synchronized with the internal clock signal ICLK at a point which is in advance by the delay signal DLY from the write latency WL.

The write latency control signal WL_CTL may be generated at a point (WL-DLY) in which the converted number of cycles of the internal clock signal ICLK of the delay signal DLY is subtracted from the write latency WL. That is, the write latency control signal WL_CTL may be generated prior to the first delay time tD of the write path circuit 208 in the write latency WL Also, the write latency control signal WL_CTL may be activated during a section corresponding to the burst length BL. The write latency control signal WL_CTL is provided to the second input terminal of the first multiplexer 206.

In the command window generator 140a, the initialization signal INIT may be provided, for example, at a logic low, for an initialization operation of the memory device 100 (FIG. 1) for setting various operation modes. When the initialization operation has completed, the initialization signal INIT may be provided, for example, at a logic high. The first multiplexer 206 selects the write latency control signal WL_CTL input to the second input terminal and provides the write latency control signal WL_CTL to the write path circuit 208, in response to a logic high of the initialization signal INIT.

The write latency control signal WL_CTL provided to the write path circuit 208 is delayed by the first delay time tD of the write path circuit 208 by passing through the write path circuit 208. Accordingly, an output of the write path circuit 208 may be output in correspondence to the write latency WL, since the write latency control signal WL_CTL generated prior to the first delay time tD of the write path circuit 208 in the write latency WL is delayed by the first delay time tD of the write path circuit 208. The output of the write path circuit 208 is provided to the second multiplexer 210.

The second multiplexer 210 provides the output of the write path circuit 208 as the write command window WR_WIN in response to a logic high of the initialization signal INIT. Since the output of the write path circuit 208 is in correspondence to the write latency WL, and corresponds to the burst length BL, the write command window WR_WIN may be generated by being set on the write data window corresponding to the burst length BL in the write latency WL.

The write command window WR_WIN is provided to the data input circuit 160 (FIG. 1), and the data input circuit 160 may directly latch the write data input to the data bus DQ in response to the write command window WR_WIN. The data input circuit 160 does not need to be driven in advance and stand by to latch the write data, and thus, current consumption of the data input circuit 160 may be reduced. Accordingly, power consumption of the memory device 100 (FIG. 1) may be reduced.

Figure 5:
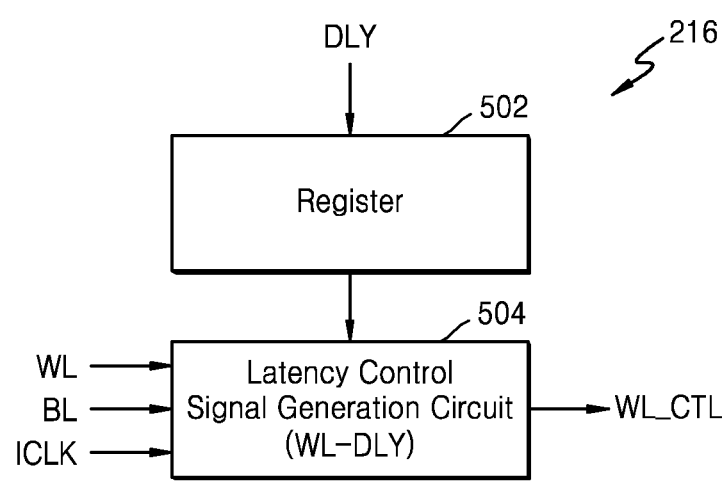
FIG. 5 is a diagram of a latency control circuit of FIG. 2 according to an exemplary embodiment of the inventive concept.

FIG. 5 is a diagram of the latency control circuit 216 of FIG. 2 according to an exemplary embodiment of the inventive concept.

Referring to FIG. 5, the latency control circuit 216 includes a register 502 and a latency control signal generation circuit 504. The register 502 stores the delay signal DLY provided from the delay measure circuit 214 and transmits the delay signal DLY to the latency control signal generation circuit 504.

The latency control signal generation circuit 504 receives the write latency WL, the burst length BL, and the delay signal DLY, and generates the write latency control signal WL_CTL synchronized with the internal clock signal ICLK prior to the write latency WL by the delay signal DLY. The write latency WL and the burst length BL are provided based on the internal clock signal ICLK.

In the latency control signal generation circuit 504, by an operation of subtracting the number of cycles of the internal clock signal ICLK corresponding to the delay signal DLY from the write latency WL, the write latency control signal WL_CTL may be synchronized with the internal clock signal ICLK prior to the write latency WL by the number of cycles of the delay signal DLY. In an embodiment, the write latency control signal WL_CTL is activated during a section corresponding to the burst length BL of the write data.

Figure 6:
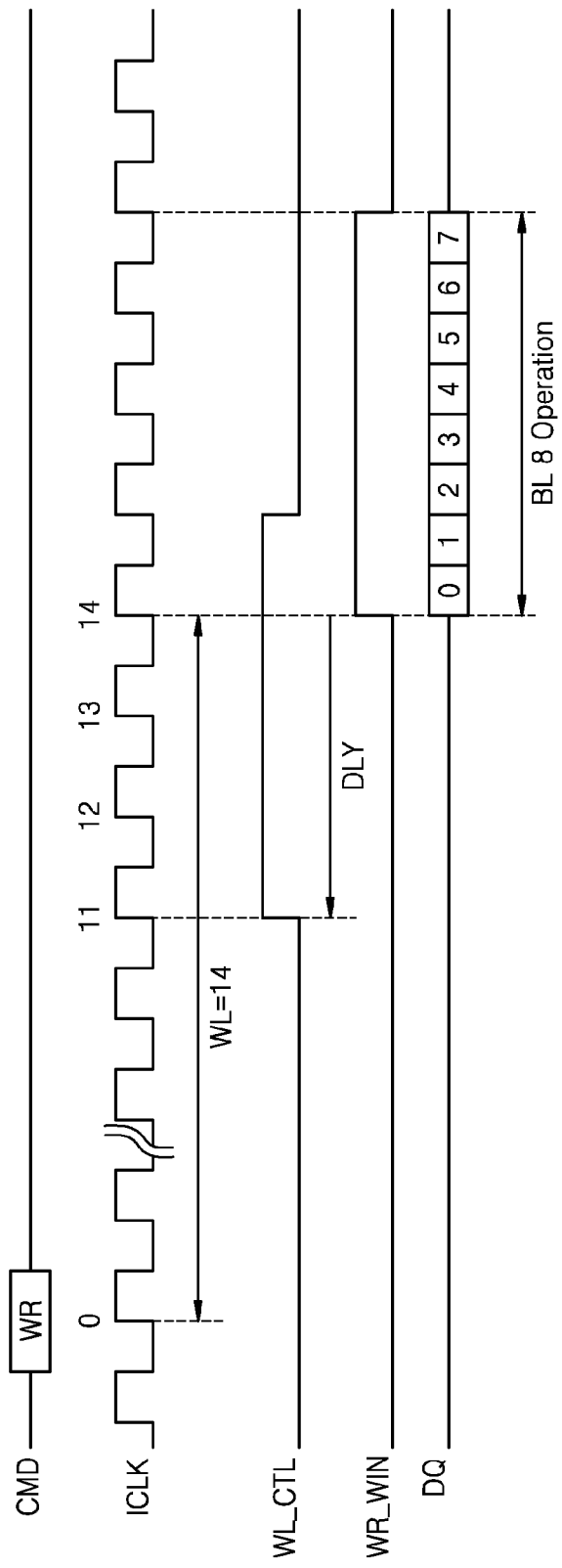
FIGS. 6 and 7 are diagrams for describing an operation of the memory device of FIG. 1.

FIG. 6 is a diagram for describing a write operation of the memory device 100 of FIG. 1. In the write operation of the memory device 100, the write latency WL is 14 cycles and the burst length BL is 8 units (e.g., words, double-words, bytes, etc.) of data.

Referring to FIGS. 6 and 2 together, the write data corresponding to the burst length BL of 8 is input to the data bus DQ at the write latency. For example, the write command WR is received at a point 0 with respect to the internal clock signal CLK. The write data corresponding to the burst length BL of 8 data units begins to be input to the data bus DQ at a point 14 with respect to the internal clock signal CLK, which corresponds to a write latency of 14 cycles.

When the number of cycles of the delay signal DLY measured in the delay measure circuit 214 is, for example, 3, the write latency control signal WL_CTL is activated at a point 11 with respect to the internal clock signal ICLK, which is obtained by subtracting the number of cycles of the delay signal DLY (i.e., 3 cycles) from the write latency WL (i.e., 14 cycles) from the write command WR. Also, the write latency control signal WL_CTL is activated during a clock cycle 4 of the internal clock signal ICLK according to the operation of the burst length BL 8.

The write latency control signal WL_CTL is output as the write command window WR_WIN by being delayed by the first delay time tD of the write path circuit 208. The delay signal DLY denotes the first delay time tD of the write path circuit 208 indicated by the number of cycles of the internal clock signal ICLK, and thus, the write command window WR_WIN is output by being delayed from the write latency control signal WL_CTL, by the number of cycles of the internal clock signal ICLK (i.e., 3 cycles), which is the delay signal DLY.

The write command window WR_WIN is generated by being set on the write data window corresponding to the burst length BL at the point of the write latency WL. Accordingly, the data input circuit 160 may directly latch the write data input to the data bus DQ via the write command window WR_WIN set on the write data window.

Referring back to FIG. 2, the write latency control signal WL_CTL output to the first output terminal of the second multiplexer 210 may be provided to a one edge synchronizing circuit 220.

Figure 7:
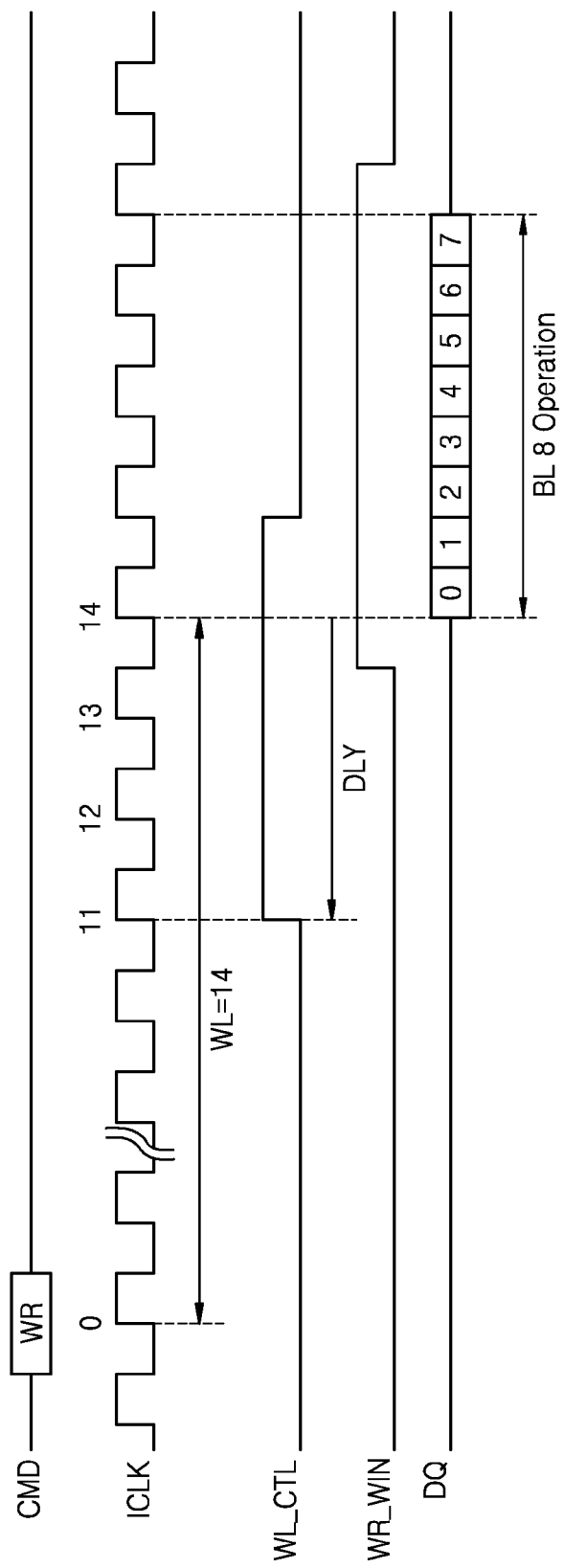

The one edge synchronizing circuit 220 generates the write command window WR_WIN have a window which is activated prior to the write data window corresponding to the burst length BL by one edge of the internal clock signal ICLK and deactivated next to the write data window by one edge of the internal clock signal ICLK, as illustrated in FIG. 7. The write command window WR_WIN may be set wider than the write data window by one clock cycle of the internal clock signal ICLK.

The write command window WR_WIN is provided to the data input circuit 160 (FIG. 1), and the data input circuit 160 may latch the write data in response to the write command window WR_WIN wider than the write data window prior to or next to the write data window by one edge of the internal clock signal ICLK. The data input circuit 160 may secure a margin for latching the write data and minimize the driving standby time, thereby reducing current consumption thereof. Accordingly, power consumption of the memory device 100 (FIG. 1) may be reduced.

Figure 8A:
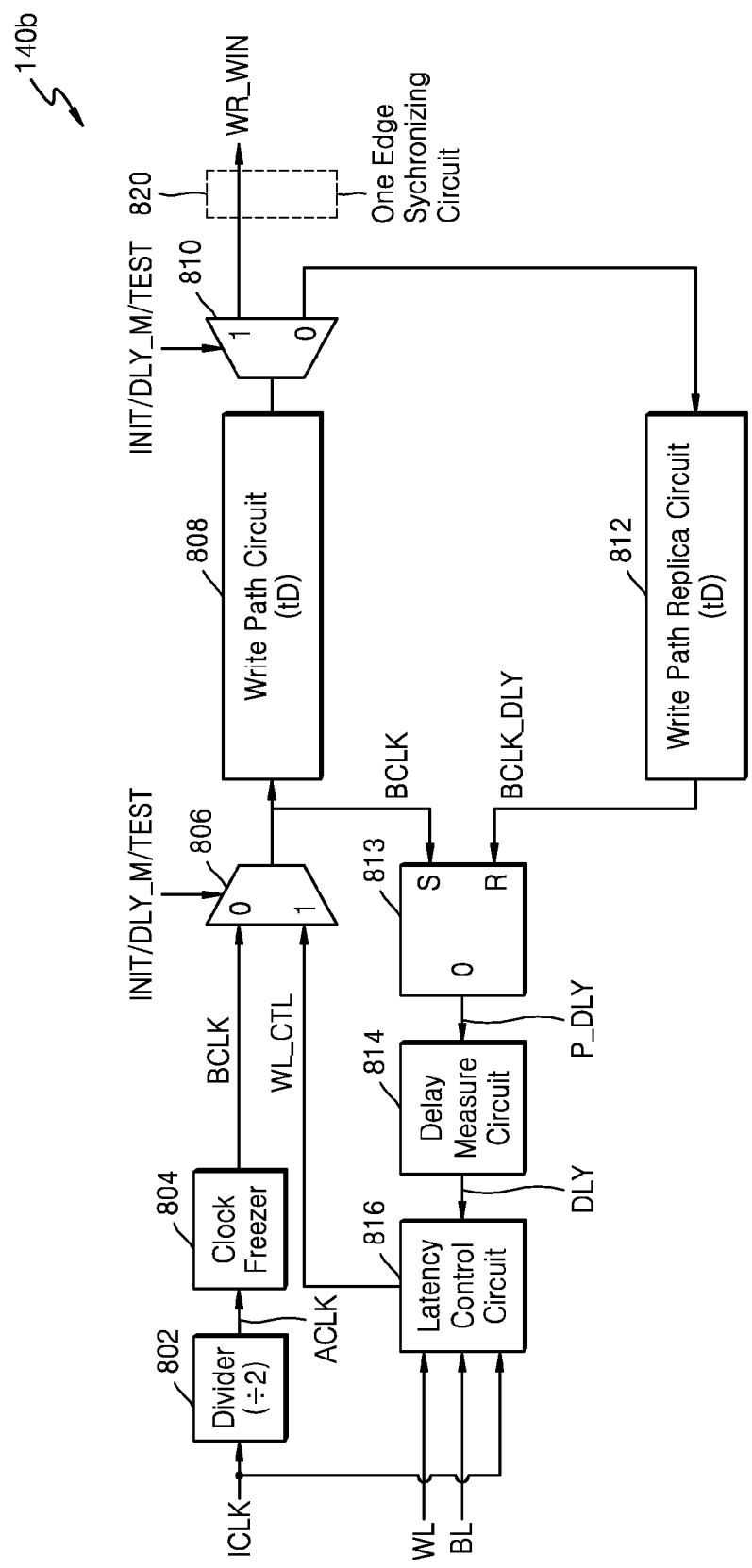

FIGS. 8A and 8B are diagrams of the command window generator 140 of FIG. 1, according to an exemplary embodiment of the inventive concept.

Referring to FIG. 8A, a command window generator 140b differs from the command window generator 140a of FIG. 2 in that in the command window generator 140b, the delay signal DLY output to a delay measure circuit 814 is determined by an output of a flip-flop 813 to which the second clock signal BCLK and the third clock signal BCLK_DLY are input.

A divider 802, a clock freezer 804, first and second multiplexers 806 and 810, a write path circuit 808, a write path replica circuit 812, a latency control circuit 816, and one edge synchronizing circuit 820 in the command window generator 140b may have the same structures and functions as the divider 202, the clock freezer 204, the first and second multiplexers 206 and 210, the write path circuit 208, the write path replica circuit 212, the latency control circuit 216, and the one edge synchronizing circuit 220 of FIG. 2, respectively.

The second clock signal BCLK which is an output of the first multiplexer 806 and the third clock signal BCLK_DLY which is an output of the write path replica circuit 812 are provided as inputs to the flip-flop 813. The flip-flop 813 may include an S-R flip-flop. The second clock signal BCLK is input to an S-input terminal of the flip-flop 813, the third clock signal BCLK_DLY is input to an R-input terminal of the flip-flop 813, and the output terminal of the flip-flop 813 is provided to the delay measure circuit 814.

The flip-flop 813 may output an output signal P_DLY which is activated in response to the second clock signal BCLK input to the S-input terminal after the freezing section FRZ and deactivated in response to the third clock signal BCLK_DLY input to the R-input terminal after the freezing section FRZ, as illustrated in FIG. 8B. The output signal P_DLY of the flip-flop 813 is provided to the delay measure circuit 814. The delay measure circuit 814 may output the delay signal DLY by counting a pulse width of the output signal P_DLY output by the flip-flop 813 as the number of cycles of the second clock signal BCLK.

In FIG. 8A, the counted number of cycles of the second clock signal BCLK, which is the delay signal DLY of the delay measure circuit 814, may be converted into the number of cycles of the internal clock signal ICLK and provided to the latency control circuit 816. The delay signal DLY denotes the first delay time tD of the write path circuit 808 indicated by the number of cycles of the internal clock signal ICLK. The latency control circuit 816 may generate the write latency control signal WL_CTL based on the write latency WL and the burst length BL, and the write latency control signal WL_CTL may be generated prior to the converted number of cycles of the internal clock signal ICLK of the delay signal DLY, from the write latency WL.

The write path circuit 808 inputs the write latency control signal WL_CTL, and outputs the write command window WR_WIN by delaying the write command window WR_WIN by the first delay time tD of the write path circuit 808. The write command window WR_WIN is output by being delayed from the write latency control signal WL_CTL by the number of cycles of the internal clock signal ICLK, which is the delay signal DLY. Accordingly, the write command window WR_WIN is generated by being set on the write data window corresponding to the burst length BL at the point of the write latency WL.

According to an embodiment, in order to secure a margin for latching write data, the command window generator 140b adjusts the write command window WR_WIN to have a window that is activated prior to the write data window corresponding to the burst length BL by one edge of the internal clock signal ICLK and is deactivated next to the write data window by one edge, by using the one edge synchronizing circuit 820.

Figure 9:
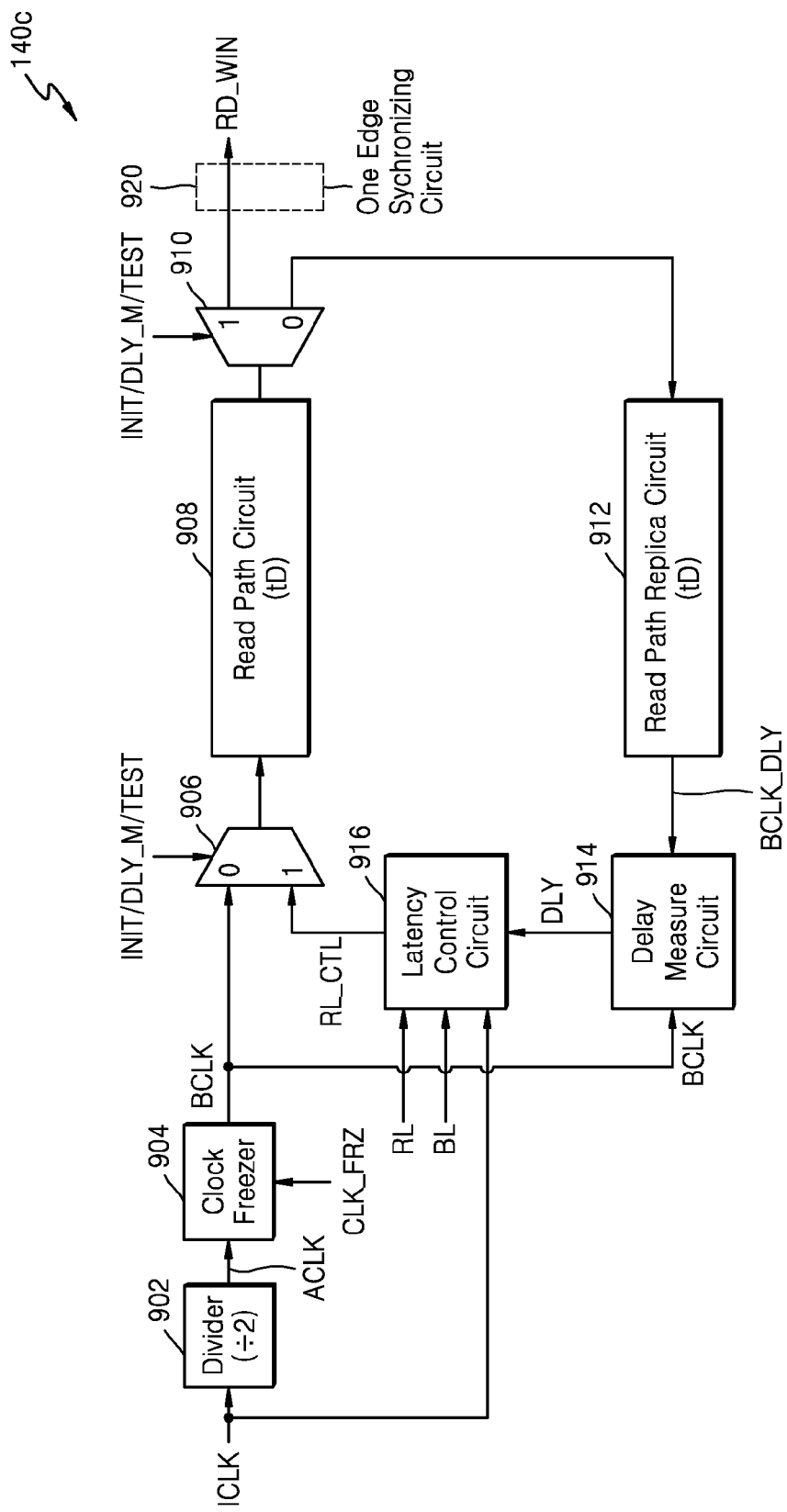
FIGS. 9 through 11 are diagrams of the command window generator of FIG. 1 according to an exemplary embodiment of the inventive concept.
Figure 10:
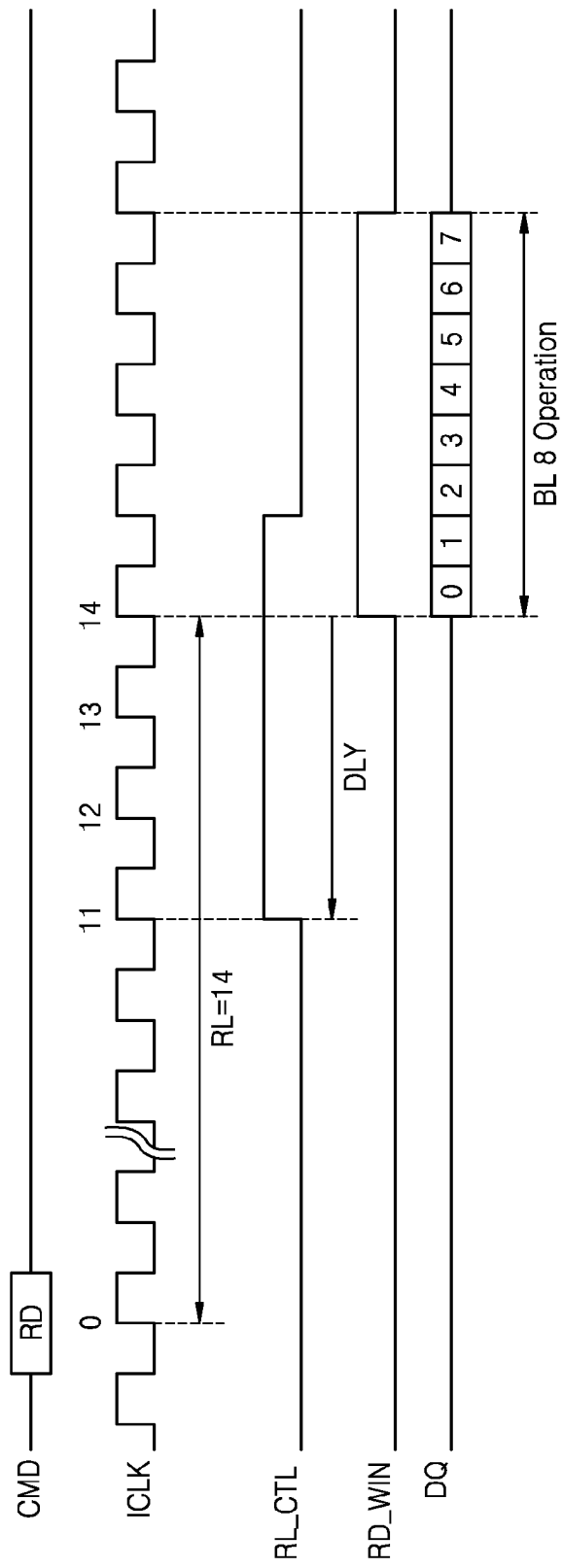
Figure 11:
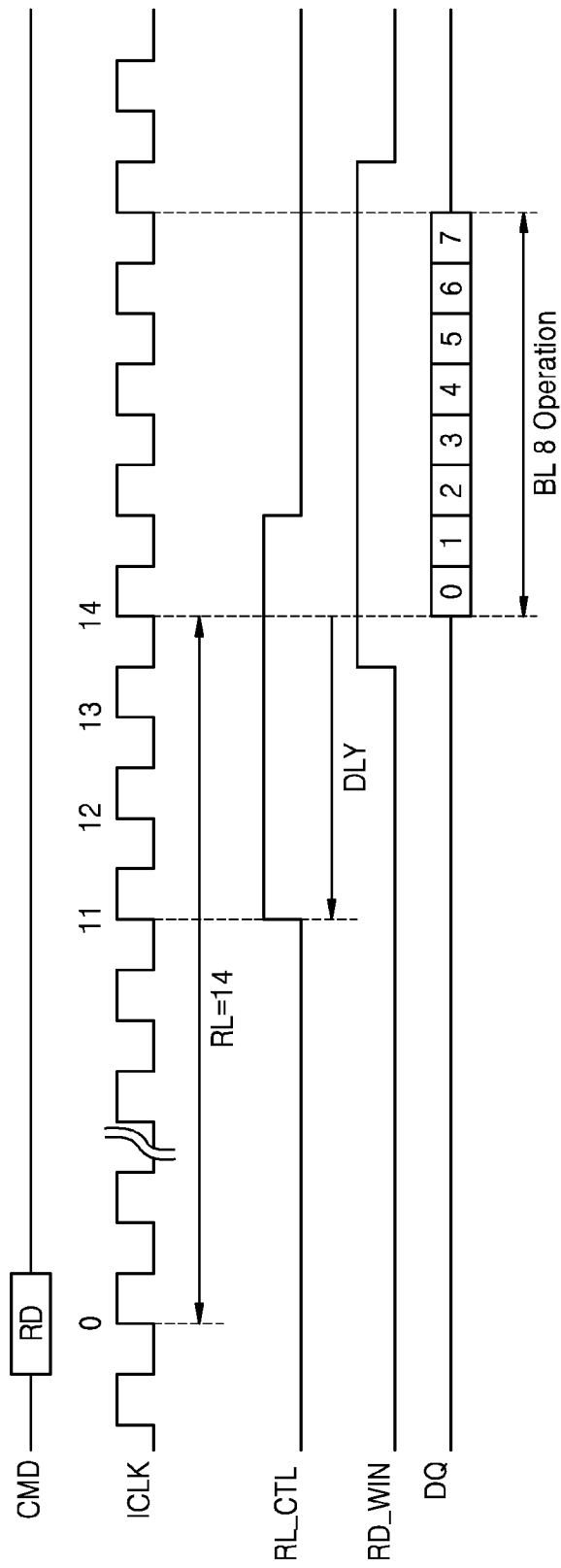

FIGS. 9 through 11 are diagrams of the command window generator 140 of FIG. 1, according to an exemplary embodiment of the inventive concept.

Referring to FIG. 9, a command window generator 140c differs from the command window generator 140a of FIG. 2 in that the command window generator 140c includes a read path circuit 908 and a read path replica circuit 912, rather than the write path circuit 208 and the write path replica circuit 212.

A divider 902, a clock freezer 904, first and second multiplexers 906 and 910, a delay measure circuit 914, a latency control circuit 916, and one edge synchronizing circuit 920 in the command window generator 140c have the same structures and functions as the divider 202, the clock freezer 204, the first and second multiplexers 206 and 210, the delay measure circuit 214, the latency control circuit 216, and the one edge synchronizing circuit 220 of FIG. 2, respectively.

The read path circuit 908 may include circuit portions that are part of a data read path and circuit portions that are part of a read command path. In an embodiment, the data read path includes the data output buffer and the data strobe buffer included in the data output circuit 170 (FIG. 1). The read command path may include the command buffer 120 (FIG. 1) and the command decoder 130 (FIG. 1).

The read path circuit 908 may receive the second clock signal BCLK transmitted via the first multiplexer 906 and output the second clock signal BCLK after the first delay time tD which is the sum of delay times on the data read path and/or the data command path. The output of the read path circuit 908 is provided to the second multiplexer 910.

The second multiplexer 910 outputs the output of the read path circuit 208 to a first output terminal or a second output terminal, in response to an initialization signal INIT, a delay measurement signal DLY_M, or a test signal TEST. The first output terminal of the second multiplexer 910 provides the read command window RD_WIN, and the second output terminal is connected to the read path replica circuit 912.

The read path replica circuit 912 may have the same structure as the read path circuit 908. The read path replica circuit 912 inputs the output of the read path circuit 908, which is output by the second output terminal of the second multiplexer 910. The read path replica circuit 912 may output the output of the read path circuit 908 after the first delay time tD which is the same as the first delay time tD of the read path circuit 908.

The input to the read path replica circuit 912 is the second clock signal BCLK output by the clock freezer 904, which is provided via the first multiplexer 906, the read path circuit 908, and the second multiplexer 910 when, for example, the initialization signal INIT is at a logic low. Accordingly, the second clock signal BCLK input to the read path replica circuit 912 may be output as the third clock signal BCLK_DLY by being delayed by a delay time 2*tD, which is twice the sum of the first delay time tD of the read path circuit 908 and the first delay time tD of the read path replica circuit 912. The third clock signal BCLK_DLY is provided to the delay measure circuit 914.

The delay measure circuit 914 may output the delay signal DLY by counting the freezing section FRZ of the third clock signal BCLK_DLY as the number of cycles of the second clock signal BCLK. The counted number of cycles of the second clock signal BCLK, which is the delay signal DLY of the delay measure circuit 914, is converted into the number of cycles of the internal clock signal ICLK, and provided to the latency control circuit 916. The delay signal DLY denotes the first delay time tD of the read path circuit 908 indicated by the number of cycles of the internal clock signal ICLK.

The latency control circuit 916 generates a read latency control signal RL_CTL based on the read latency RL and the burst length BL, and the read latency control signal RL_CTL may be generated prior to the converted number of cycles of the internal clock signal ICLK of the delay signal DLY, from the read latency RL.

The read path circuit 908 receives an input of the read latency control signal RL_CTL and outputs the read command window RD_WIN by delaying the read command window RD_WIN by the first delay time tD of the read path circuit 908. The read command window RD_WIN is output by being delayed from the read latency control signal RL_CTL by the number of cycles of the internal clock signal ICLK, which is the delay signal DLY. Accordingly, the read command window RD_WIN is generated by being set on the read data window corresponding to the burst length BL at the point of the read latency FL.

In FIG. 10, in the read operation of the memory device 100 (FIG. 1), the read latency RL is 14 cycles and the burst length BL is 8 data units.

Read data corresponding to the burst length BL of 8 data units is output from the memory cell array 150 (FIG. 1) after the read latency RL. For example, the read command RD is received at a point 0 with respect to the internal clock signal CLK. The read data corresponding to the burst length BL of 8 data units begins to be output from the memory cell array 150 at a point 14 with respect to the internal clock signal CLK, which corresponds to a read latency RL of 14 cycles.

When the number of cycles of the delay signal DLY measured in the delay measure circuit 914 (FIG. 9) is, for example, 3, the read latency control signal RL_CTL may be activated at a point 11 with respect to the internal clock signal ICLK, which is obtained by subtracting the number of cycles of the delay signal DLY (i.e., 3 cycles) from the read latency RL (i.e., 14 cycles) from the read command RD. Also, the read latency control signal RL_CTL is activated during a clock cycle 4 of the internal clock signal ICLK according to the operation of the burst length BL of 8 data units.

The read latency control signal RL_CTL is output as the read command window RD_WIN by being delayed by the first delay time tD of the read path circuit 908 (FIG. 9). The delay signal DLY denotes the first delay time tD of the read path circuit 908 indicated by the number of cycles of the internal clock signal ICLK, and thus, the read command window RD_WIN is output by being delayed from the read latency control signal RL_CTL by 3, the number of cycles of the internal clock signal ICLK, which is the delay signal DLY, from the read latency control signal RL_CTL.

The read command window RD_WIN is generated by being set on the read data window corresponding to the burst length BL at the point of the read latency WL. Accordingly, the data output circuit 170 (FIG. 1) may latch the read data via the read command window RD_WIN set on the read data window, and output the read data to the data bus DQ.

In FIG. 9, the command window generator 140c may adjust the read command window RD_WIN to have a window that is activated prior to the read data window corresponding to the burst length BL by one edge of the internal clock signal ICLK and deactivated next to the read data window by one edge of the internal clock signal ICLK, as illustrated in FIG. 11, by using the one edge synchronizing circuit 920.

The read command window RD_WIN may be set wider than the read data window by one clock cycle of the internal clock signal ICLK. For example, the read data window shown in FIG. 11 corresponds to the duration of the burst data of the burst length BL. The data output circuit 170 (FIG. 1) may latch the read data and output the read data to the data bus DQ, in response to the read command window RD_WIN wider than the read data window prior to or next to the read data window by one edge of the internal clock signal ICLK. The data output circuit 170 may secure a margin for latching the read data and minimize the driving standby time, thereby reducing current consumption thereof. Accordingly, power consumption of the memory device 100 (FIG. 1) may be reduced. In an exemplary embodiment, power to the data output circuit is suppressed until the read command window RD_WIN transitions from a first logic level to a second logic level at one clock edge before the data is available during the read data window.

Figure 12:
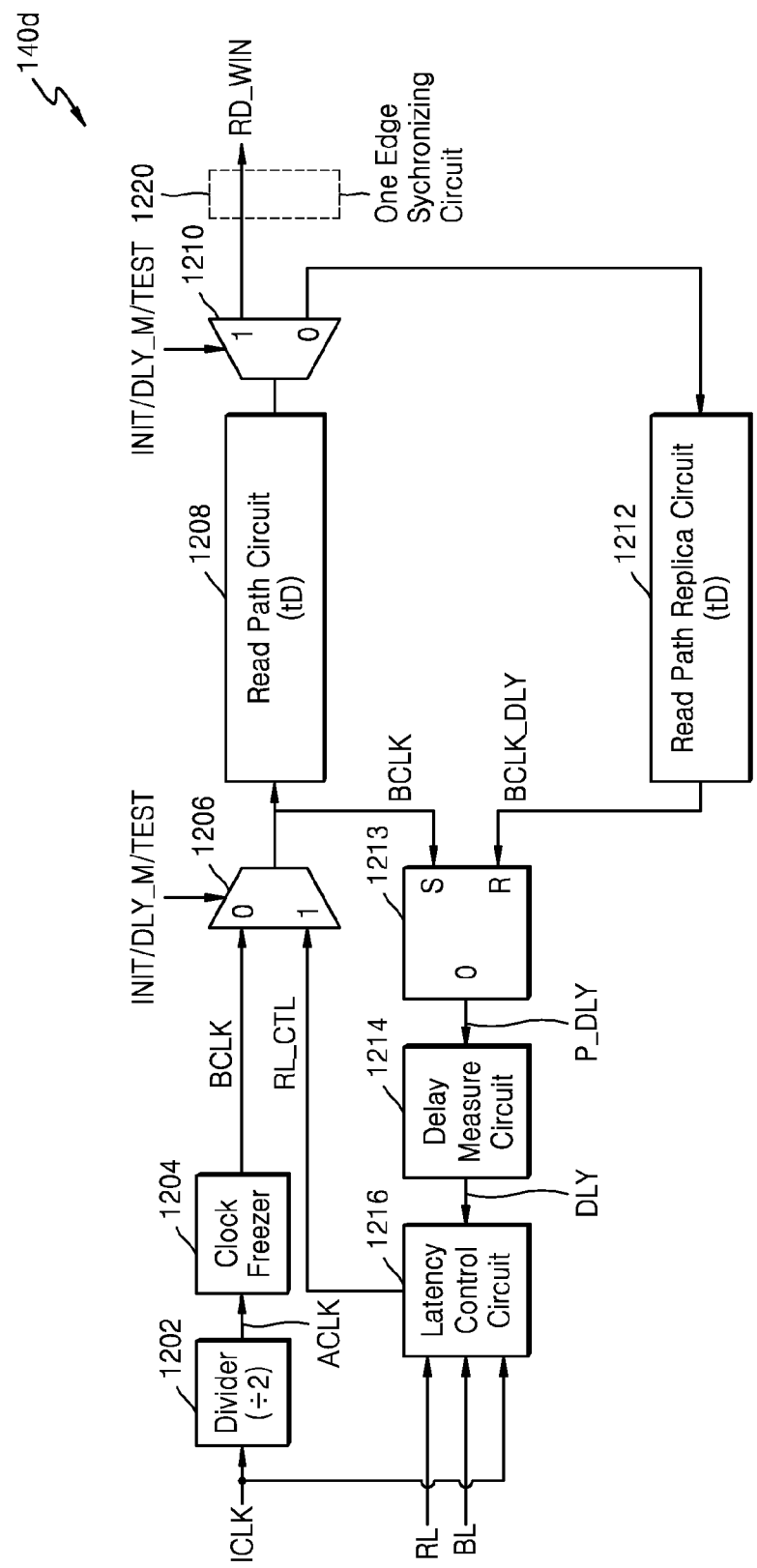
FIG. 12 is a diagram of the command window generator of FIG. 1 according to an exemplary embodiment of the inventive concept.

FIG. 12 is a diagram of the command window generator 140 of FIG. 1 according to an exemplary embodiment of the inventive concept.

Referring to FIG. 12, a command window generator 140d differs from the command window generator 140b of FIG. 8A in that the command window generator 140d includes a read path circuit 1208 and a read path replica circuit 1212, rather than the write path circuit 808 and the write path replica circuit 812.

A divider 1202, a clock freezer 1204, first and second multiplexers 1206 and 1210, a flip-flop 1213, a delay measure circuit 1214, a latency control circuit 1216, and one edge synchronizing circuit 1220 in the command window generator 140d have the same structures and functions as the divider 802, the clock freezer 804, the first and second multiplexers 806 and 810, the flip-flop 813, the delay measure circuit 814, the latency control circuit 816, and the one edge synchronizing circuit 820 of FIG. 8A, respectively.

The read path circuit 1208 may receive the second clock signal BCLK transmitted via the first multiplexer 1206 and output the second clock signal BCLK after the first delay time tD which is the sum of delay times on the data read path and/or the read command path. The output of the read path circuit 1208 is provided to the second multiplexer 1210.

The read path replica circuit 1212 may have the same structure as the read path circuit 1208. The read path replica circuit 1212 receives as an input the output of the read path circuit 1208, which is output from a second output terminal of the second multiplexer 1210. The read path replica circuit 1212 may output the output of the read path circuit 1208 after the first delay time tD which is the same as the first delay time tD of the read path circuit 1208.

The second clock signal BCLK which is the output of the first multiplexer 1206 and the third clock signal BCLK_DLY which is the output of the read path replica circuit 1212 are provided as inputs to the flip-flop 1213. The second clock signal BCLK may be input to an S-input terminal of the flip-flop 1213, the third clock signal BCLK_DLY may be input to an R-input terminal of the flip-flop 1213, and an output signal P_DLY may be output from an output terminal of the flip-flop 1213.

The output signal P_DLY of the flip-flop 1213 is provided to the delay measure circuit 1214. The delay measure circuit 1214 may output the delay signal DLY by counting a pulse width of the output signal P_DLY of the flip-flop 1213 as the number of cycles of the second clock signal BCLK. The counted number of cycles of the second clock signal BCLK, which is the delay signal DLY of the delay measure circuit 1214, may be converted into the number of cycles of the internal clock signal ICLK and provided to the latency control signal generator 1216.

The latency control circuit 1216 may generate the read latency control signal RL_CTL based on the read latency RL and the burst length BL, and the read latency control signal RL_CTL may be generated prior to the converted number of cycles of the internal clock signal ICLK of the delay signal DLY in the read latency RL.

The read path circuit 1208 receives as an input the read latency control signal RL_CTL, and outputs the read command window RD_WIN by delaying the read command window RD_WIN by the first delay time tD of the read path circuit 1208. The read command window RD_WIN is output by being delayed from the read latency control signal by the number of cycles of the internal clock signal ICLK, which is the delay signal DLY. Accordingly, the read command window RD_WIN may be generated in correspondence to the read data window corresponding to the burst length BL at the point of the read latency RL.

According to an exemplary embodiment of the inventive concept, in order to secure a margin for latching the read data, the command window generator 140*d* adjusts the read command window RD_WIN to have a window which is activated prior to the read data window corresponding to the burst length BL by one edge of the internal clock signal ICLK and is deactivated next to the read data window by one edge of the internal clock signal ICLK, by using the one edge synchronizing circuit 1220. For example, the read command window RD_WIN is deactivated (e.g., set from the second logic level to the first logic level) one clock edge after the read data window has ended. The read command window RD_WIN may be set wider than the read data window by one clock cycle of the internal clock signal ICLK. For example, the read command window RD_WIN may be activated a half of one cycle before the read data window begins and be deactivated a half of one cycle after the read data window ends.

In response to the read command window RD_WIN being wider than the read data window prior to or next to the read data window by one edge of the internal clock signal ICLK, the data output circuit 170 (FIG. 1) may latch the read data and output the read data to the data bus DQ. The data output circuit 170 may secure a margin for latching the read data and minimize the driving standby time, thereby reducing current consumption thereof. Accordingly, power consumption of the memory device 100 (FIG. 1) may be reduced.

Figure 13:
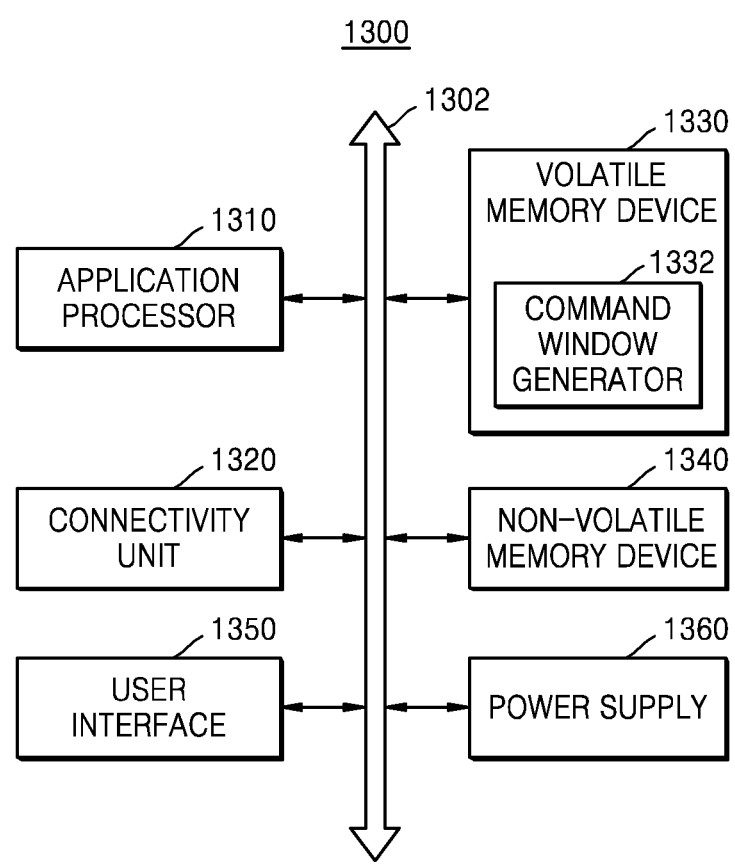
FIG. 13 is a block diagram of an example of a mobile system to which a memory device including a command window generator, according to an embodiment of the inventive concept, is applied.

FIG. 13 is a block diagram of an example of a mobile system 1300 to which a memory device including a command window generator, according to an embodiment of the inventive, is applied.

Referring to FIG. 13, the mobile system 1300 includes an application processor 1310, a connectivity unit 1320, a first memory device 1330, a second memory device 1340, a user interface 1350, and a power supply 1360, which are connected to one another via a bus 1302. The first memory device 1330 may be a volatile memory device and the second memory device 1340 may be a nonvolatile memory device.

According to an embodiment, the mobile system 1300 may include mobile systems, such as a mobile phone, a smart phone, a personal digital assistant (PDA), a portable multimedia player (PMP), a digital camera, a music player, a portable game console, a navigation system, etc.

The application processor 1310 may execute applications providing an internet browser, a game, a video, etc. According to an embodiment, the application processor 1310 includes a single core processor or multi-core processors. For example, the application processor 1310 may include a dual-core processor, a quad-core processor, or a hexa-core processor. Also, according to an embodiment, the application processor 1310 further includes cache memory located inside or outside the application processor 1310.

The connectivity unit 1320 may perform wireless or wired communication with external devices. For example, the connectivity unit 1320 may include a transceiver that enables wired or wireless communication. For example, the connectivity unit 1320 may perform Ethernet communication, near field communication (NFC), radio frequency identification (RFID) communication, mobile telecommunication, memory card communication, universal serial bus (USB) communication, etc. For example, the connectivity unit 1320 may include a baseband chip set and may support communication, such as global system/standard for mobile communication (GSM), general packet radio service (GPRS), wideband code division multiple access (WCDMA), HSxPA, etc.

The first memory device 1330 which is a volatile memory device may store data processed by the application processor 1310 as write data, or operate as working memory. The first memory device 1330 may include a command window generator 1332 generating a command window for processing data associated with a command after a certain latency from receipt of the command, where the command may be synchronized with a clock signal.

The command window generator 1332 may generate a delay signal which is obtained by converting a delay time between a second clock signal having a freezing section input to a write path circuit and a third clock signal output to a write path replica circuit into the number of cycles of an internal clock signal, by using the write path circuit and the write path replica circuit having the same structure as the write path circuit and connected in series with the write path circuit. Also, the command window generator 1332 may generate a command window set on a data window corresponding to a burst length of the write data, in response to a write latency and the delay signal.

The command window generator 1332 may generate a delay signal which is obtained by converting a delay time between a second clock signal having a freezing section input to a read path circuit and a third clock signal output to a read path replica circuit into the number of cycles of the internal clock signal, by using the read path circuit and the read path replica circuit having the same structure as the read path circuit and connected in series with the read path circuit. Also, the command window generator 1332 may generate a command window set on a data window corresponding to a burst length of the read data, in response to a read latency and the delay signal.

The second memory device 1340 which is a non-volatile memory device may store a boot image for booting the mobile system 1300. For example, the non-volatile memory device 1340 may be realized as memories, such as electrically erasable programmable read-only memory (EEPROM), flash memory, phase change random access memory (PRAM), resistance random access memory (RRAM), nano-floating gate memory (NFGM), polymer random access memory (PoRAM), magnetic random access memory (MRAM), ferroelectric random access memory (FRAM), or memories similar thereto.

The user interface 1350 may include at least one input device, such as a keypad, a touch screen, etc., and/or at least one output device, such as a speaker, a display device, etc. The power supply 1360 may apply operating voltages. Also, according to an embodiment, the mobile system 1300 may further include a camera image processor (CIP), and a storage device, such as a memory card, solid state drive (SSD), hard disk drive (HDD), CD-ROM, etc.

While the inventive concept has been particularly shown and described with reference to embodiments thereof, it will be understood that various changes in form and details may be made therein without departing from the spirit and scope of the inventive concept.

What is claimed is:

1. A command window generator configured to generate a command window for processing data associated with a command after a certain latency from receipt of the command, the command window generator comprising:

a clock freezer circuit configured to receive a first clock signal divided from an input clock signal and generate a second clock signal from the first clock signal, where the second clock signal has a freezing section corresponding to a logic low section of a clock freezing signal;

a first circuit configured to receive the second clock signal as an input, and output the second clock signal after a first delay time;

a second circuit having the same structure as the first circuit and configured to receive an output of the first circuit as an input, and output a third clock signal after the first delay time; and a delay measure circuit configured to receive the second clock signal and the third clock signal as inputs, generate a delay signal by converting a delay time between the second clock signal and the third clock signal into a number of cycles of the input clock signal, and generate the command window to correspond to a data window of the data using the delay signal.

2. The command window generator of claim 1, wherein the delay measure circuit generates a latency control signal generated at a point in which the delay signal is subtracted from the latency, and the first circuit receives the latency control signal as an input and outputs the command window after the first delay time.

3. The command window generator of claim 1, wherein the delay measure circuit outputs the number of cycles of the second clock signal which is counted in a freezing section of the third clock signal as the delay signal, and converts the number of cycles of the second clock signal of the delay signal into the number of cycles of the input clock signal.

4. The command window generator of claim 1, wherein the command window generator further comprises a latency control circuit configured to generate a latency control signal based on the latency and a burst length, and the latency control circuit is configured to generate the latency control signal prior to the converted number of cycles of the clock signal of the delay signal from the latency.

5. The command window generator of claim 4, wherein the latency control signal is generated by being activated during the data window corresponding to the burst length.

6. The command window generator of claim 5, further comprising a one edge synchronizing circuit configured to provide the command window output by the first circuit such that the command window has a window which is activated prior to the data window by one edge of the input clock signal and is deactivated one edge of the input clock signal after the data window.

7. The command window generator of claim 1, wherein the first circuit comprises circuits part of a data write path and a write command path.

8. The command window generator of claim 1, wherein the first circuit comprises circuits part of a data read path and a read command path.

9. A memory device comprising:
a memory cell array comprising a plurality of memory cells;
a clock buffer configured to generate an internal clock signal in response to a clock signal CLK input thereto;
a command decoder configured to generate a command signal by decoding a command which is received in synchronization with the internal clock signal;

a command window generator configured to generate a command window for processing data associated with a command after a certain latency from receipt of the command; and an input and output buffer configured to receive write data and provide the write data to the memory cell array, and provide read data read from the memory cell array to a data bus, in response to the command window, wherein the command window generator is configured to generate a delay signal by converting a delay time between a second clock signal input to a first circuit and a third clock signal output to a second circuit into a number of cycles of the internal clock signal, by using the first circuit and the second circuit having the same structure as the first circuit and connected in series with the first circuit, and adjust the command window to correspond to a data window of the data using the delay signal.

10. The memory device of claim 9, wherein the command window generator comprises:

a clock freezer circuit configured to receive a first clock signal divided from the internal clock signal and generate the second clock signal from the first clock signal, wherein the second clock signal has a freezing section corresponding to a logic low section of a clock freezing signal;

a first circuit configured to receive the second clock signal as an input, and output the second clock signal after a first delay time;

a second circuit having the same structure as the first circuit and configured to receive an output of the first circuit as an input, and output the third clock signal after the first delay time; and a delay measure circuit configured to receive the second clock signal and the third clock signal as inputs and generate the delay signal; and a latency control signal generator configured to generate a latency control signal based on the latency and a burst length of the write data or the read data, wherein the latency control signal is generated prior to the converted number of cycles of the internal clock signal of the delay signal from the latency, wherein the first circuit is configured to receive the latency control signal as an input, and output the command window after the first delay time.

11. The memory device of claim 10, wherein the delay measure circuit outputs the number of cycles of the second clock signal which is counted in a freezing section of the third clock signal as the delay signal, and converts the number of cycles of the second clock signal of the delay signal into the number of cycles of the internal clock signal.

12. The memory device of claim 10, further comprising a flip flop that outputs an output signal to the delay measure circuit, wherein a first input terminal of the flip flop receives the second clock signal and a second input terminal of the flip flop receives the third block signal.

13. The memory device of claim 10, wherein the command window generator further comprises:

a first multiplexer configured comprising a first input terminal receiving the second clock signal and a second input terminal receiving the latency control signal, wherein the first multiplexer outputs one of the second clock signal and the latency control signal in response to a control signal; and a second multiplexer configured to output an output of the first circuit from one of a first output terminal of the second multiplexer or a second output terminal of the second multiplexer in response to the control signal, wherein the first output terminal of the second multiplexer provides the command window and an output of the second output terminal of the second multiplexer is provided to the second circuit.

14. The memory device of claim 13, wherein the control signal is one of an initialization signal indicating an initialization operation of the memory device, a delay measurement signal stored in a mode register of the memory device, and a test signal of the memory device.

15. The memory device of claim 10, wherein the command window generator further comprises a one edge synchronizing circuit configured to provide the command window output by the first circuit such that the command window has a window which is activated prior to the data window by one edge of the internal clock signal and is deactivated one edge of the internal clock signal after the data window.

16. A memory device comprising:
a memory cell array comprising a plurality of memory cells;
a data latch that latches data that is to be written to the memory cell array or latches data that is read from the memory cell, according to a timing control signal;
a clock dividing circuit configured to perform a dividing operation on an input clock signal to generate a first clock signal;
a shortstop circuit configured to set to a section of a first clock signal to a constant level to generate a second clock signal;
a first circuit configured to receive the second clock signal as an input, and output the second clock signal after a first delay time;
a second circuit configured to receive an output of the first circuit as an input, and output a third clock signal after the first delay time; and
a third circuit configured to generate the timing control signal by converting a delay time between the second clock signal and the third clock signal into a number of cycles of the input clock signal.

17. The memory device of claim 16, wherein the first circuit has a same structure as the second circuit.

18. The memory device of claim 16, wherein the timing control signal is activated during a data window in which the data is available on a data bus.

19. The memory device of claim 18, wherein the timing control signal is additionally activated a half of one clock signal of the input clock before and after the data window.

20. The memory device of claim 19, further comprising a one edge synchronizing circuit configured to perform the additional activation.

* * * * *